(12) United States Patent
Tsubata et al.

(10) Patent No.: US 10,847,576 B2
(45) Date of Patent: Nov. 24, 2020

(54) MAGNETIC MEMORY DEVICE AND MANUFACTURING METHOD THEREOF

(71) Applicant: TOSHIBA MEMORY CORPORATION, Tokyo (JP)

(72) Inventors: Shuichi Tsubata, Seoul (KR); Yasuyuki Sonoda, Seoul (KR); Kazuhiro Tomioka, Seoul (KR); Takao Ochiai, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/353,327

(22) Filed: Mar. 14, 2019

(65) Prior Publication Data

US 2020/0083290 A1    Mar. 12, 2020

(30) Foreign Application Priority Data

Sep. 11, 2018  (JP) .................................. 2018-169747

(51) Int. Cl.
| | |
|---|---|
| *H01L 27/22* | (2006.01) |
| *H01L 43/12* | (2006.01) |
| *H01L 43/08* | (2006.01) |
| *H01L 43/10* | (2006.01) |

(52) U.S. Cl.
CPC ............ *H01L 27/228* (2013.01); *H01L 43/12* (2013.01); *H01L 43/08* (2013.01); *H01L 43/10* (2013.01)

(58) Field of Classification Search
CPC ......... H01L 43/02; H01L 43/08; H01L 43/12; H01L 27/2481; H01L 27/222; H01L 21/76877

See application file for complete search history.

(56) References Cited

U.S. PATENT DOCUMENTS

| | | | |
|---|---|---|---|
| 2013/0069183 A1 | 3/2013 | Assefa et al. | |
| 2013/0075840 A1 | 3/2013 | Satoh et al. | |
| 2014/0042567 A1 | 2/2014 | Jung et al. | |
| 2016/0379696 A1* | 12/2016 | Kumura ................ | G11C 11/161 |
| | | | 257/421 |
| 2019/0165260 A1* | 5/2019 | Yu ........................ | H01F 10/3254 |

FOREIGN PATENT DOCUMENTS

JP         2002111096 A       4/2002

* cited by examiner

*Primary Examiner* — Changhyun Yi

(74) *Attorney, Agent, or Firm* — Holtz, Holtz & Volek PC

(57) ABSTRACT

According to one embodiment, a magnetic memory device includes a stacked structure including a magnetic layer, a first insulating layer covering the stacked structure and including a protrusion based on the stacked structure, a second insulating layer provided on the first insulating layer, and an electrode connected to the stacked structure. The first insulating layer has a first hole passing through the first insulating layer, the electrode is connected to the stacked structure at least through the first hole, the second insulating layer has a second hole inside of which a part of the electrode and the protrusion are provided, and the second hole includes a part whose area increases toward the stacked structure.

14 Claims, 9 Drawing Sheets

MAGNETIC MEMORY DEVICE AND MANUFACTURING METHOD THEREOF

CROSS-REFERENCE TO RELATED APPLICATIONS

This application is based upon and claims the benefit of priority from Japanese Patent Application No. 2018-169747, filed Sep. 11, 2018, the entire contents of which are incorporated herein by reference.

FIELD

Embodiments described herein relate generally to a magnetic memory device and a manufacturing method of the same.

BACKGROUND

Magnetic memory devices including a magnetoresistive element and a MOS transistor integrated on a semiconductor substrate (semiconductor integrated circuit devices) are proposed.

On the magnetoresistive element, a top electrode is formed to electrically connect a bit line and the magnetoresistive element.

However, forming a top electrode on a suitable position of the magnetoresistive element has been difficult.

DETAILED DESCRIPTION

In general, according to one embodiment, a magnetic memory device includes: a stacked structure including a magnetic layer; a first insulating layer covering the stacked structure and including a protrusion based on the stacked structure; a second insulating layer provided on the first insulating layer and formed of a material different from a material of the first insulating layer; and an electrode connected to the stacked structure, wherein the first insulating layer has a first hole passing through the first insulating layer, the electrode is connected to the stacked structure at least through the first hole, the second insulating layer has a second hole inside of which a part of the electrode and the protrusion are provided, and the second hole includes a part whose area increases toward the stacked structure.

Hereinafter, embodiments will be described with reference to accompanying drawings.

Figure 1:
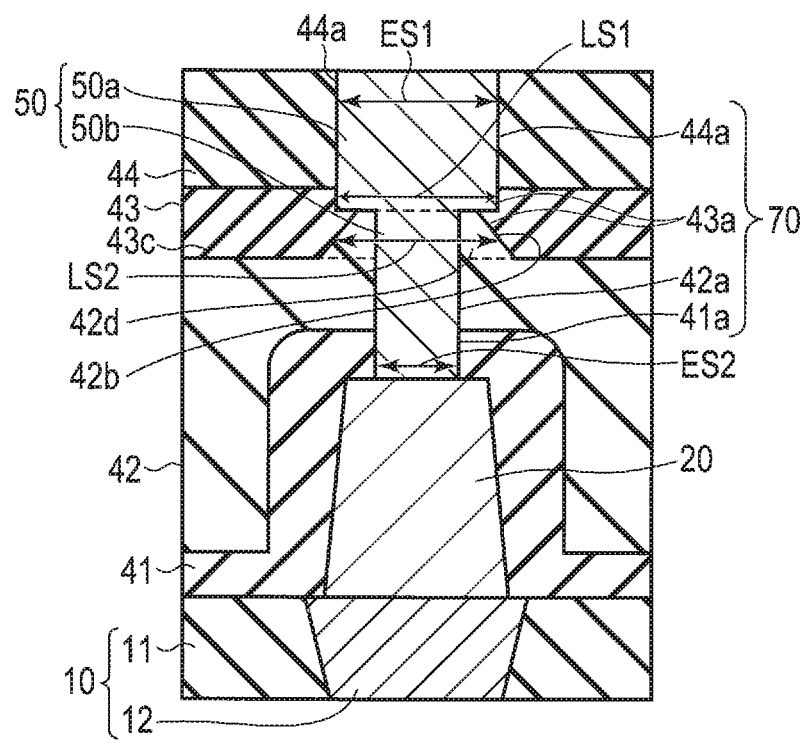
FIG. 1 is a schematic cross-sectional view of the structure of a magnetic memory device of an embodiment.

FIG. 1 is a schematic cross-sectional view of the structure of a magnetic memory device (semiconductor integrated circuit device) of an embodiment.

A bottom structure 10 includes, for example, a semiconductor substrate (not shown), MOS transistor (not shown), interlayer insulating film 11, and bottom electrode 12. The MOS transistor is provided with the surface region of the semiconductor substrate. The interlayer insulating film 11 is formed of, for example, a silicon oxide (SiO).

The bottom electrode 12 is disposed in the interlayer insulating film 11, and electrically connects the MOS transistor and the magnetoresistive element which will be described later.

On the bottom structure 10, a stacked structure 20 for the magnetoresistive element is disposed. Note that the magnetoresistive element may be referred to as a magnetic tunnel junction (MTJ) element.

The stacked structure 20 is covered with a first insulating layer 42 and a third insulating layer 41.

Figure 5A:
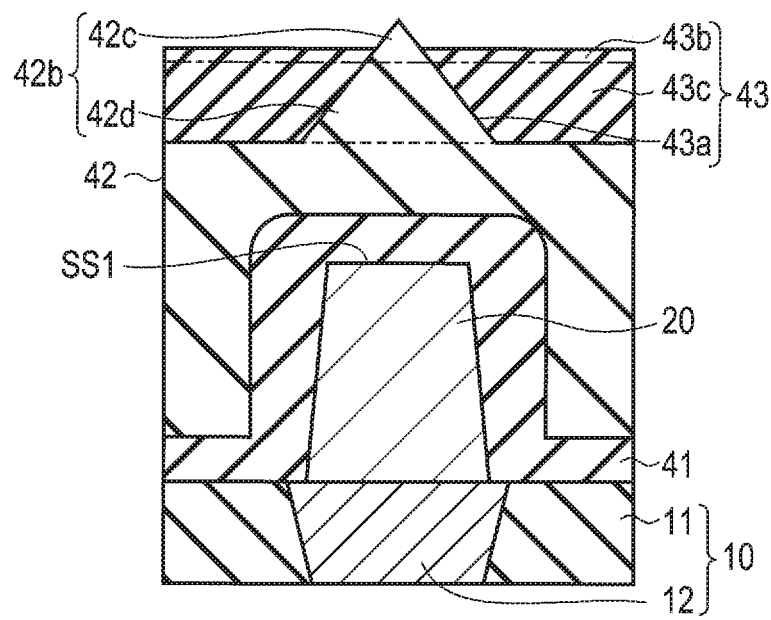
FIGS. 5A and 5B are schematic cross-sectional views of a part of the manufacturing method of the magnetic memory device of the embodiment.
Figure 5B:
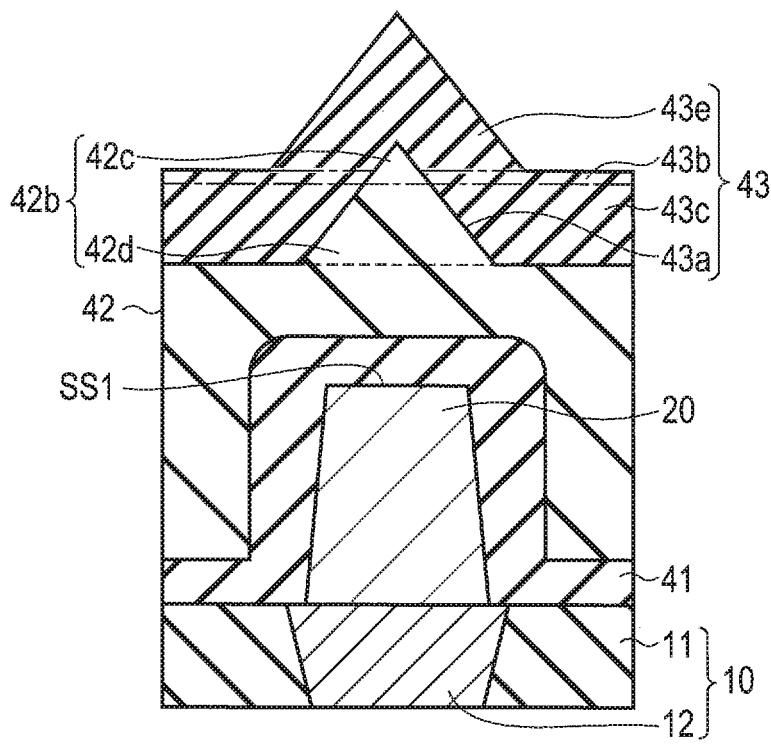

The first insulating layer 42 is an interlayer insulating film and is formed of a silicon oxide (SiO). Furthermore, the first insulating layer 42 includes a protrusion 42b which is based on the stacked structure 20. As will be described later, in a manufacturing process of the magnetic memory device of the embodiment, the protrusion 42b includes an upper part 42c and a lower part 42d as shown in FIGS. 5A and 5B, and the lower part 42d is left after the upper part 42c is polished in the manufacturing process. The lower part 42d has a conical shape apex side part of which is cut parallel to the bottom surface thereof.

The protrusion 42*b* (lower part 42*d*) is positioned to correspond to the stacked structure 20, that is, positioned above the stacked structure 20.

Specifically, the protrusion 42*b* (lower part 42*d*) is positioned directly above the stacked structure 20. Furthermore, in the state of FIG. 1, the lower part 42*d* of the protrusion 42*b* has a cross-sectional area in a direction orthogonal to the stacking direction which increases toward the stacked structure 20 and decreases as departing from the stacked structure 20. Here, the stacking direction means a direction in which structural components of the stacked structure 20 are stacked. From another point of view, the stacking direction means a direction in which the third insulating layer 41, first insulating layer 42, second insulating layer 43, and fourth insulating layer 44 are stacked.

A first hole 42*a* is formed in the first insulating layer 42 passing through thereof. That is, the first hole 42*a* is formed to pass through the first insulating layer 42 from the upper surface of the protrusion 42*b*.

The third insulating layer 41 is disposed between the stacked structure 20 and the first insulating layer 42. The third insulating layer 41 is a film to protect the stacked structure 20. The third insulating layer 41 includes a third hole 41*a* through which a top electrode 50 can pass. The third insulating layer 41 is formed of a material which is different from a material used for the first insulating layer 42.

Specifically, the material of the third insulating layer 41 is a material etching selectivity of which is high with respect to the first insulating layer 42.

The second insulating layer 43 is disposed on the first insulating layer 42. The second insulating layer 43 includes a second hole 43*a*. The second hole 43*a* includes a first hole part and a second hole part. Within the first hole part, the lower part of a first electrode part 50*a* of the top electrode 50 is provided. Within the second hole part, a part of a second electrode part 50*b* of the top electrode 50 and the lower part 42*d* of the protrusion 42*b* are provided. The top electrode 50 will be described later.

An area LS1 of the first hole part of the second hole 43*a* does not change regardless of a distance from the stacked structure 20. On the other hand, an area LS2 of the second hole part of the second hole 43*a* increases toward the stacked structure 20. Note that the second hole 43*a* may not include both the first hole part and the second hole part, and may include only the second hole part.

Furthermore, the second insulating layer 43 is formed of a material which is different from a material used for the first insulating layer 42. Specifically, the material of the second insulating layer 43 is a material etching selectivity of which is high with respect to the first insulating layer 42. Specifically, the material of the second insulating layer 43 will be selected from a group of insulative materials such as silicon nitride (SiN), silicon boron nitride (SiBN), silicon carbon nitride (SiCN), boron nitride (BN), metal oxide, and metal nitride.

The fourth insulating layer 44 is disposed on the second insulating layer 43. The fourth insulating layer 44 includes a fourth hole 44*a* through which the top electrode 50 can pass. The fourth insulating layer 44 is formed of a silicon oxide (SiO). The material of the fourth insulating layer 44 is a material etching selectivity of which is high with respect to the third insulating layer 41 and the second insulating layer 43 and is low with respect to the first insulating layer 42.

The top electrode 50 is connected to the stacked structure 20 through the holes 42*a*, 43*a*, 41*a*, and 44*a*. That is, a through hole 70 is composed of the holes 42*a*, 43*a*, 41*a*, and 44*a*. In FIG. 1, the holes 42*a*, 43*a*, 41*a*, and 44*a* are positioned directly above the stacked structure 20 and the centers of the holes 42*a*, 43*a*, 41*a*, and 44*a* are substantially matched. However, the center of the fourth hole 44*a* of the fourth insulating layer 44 may be shifted from the centers of the other holes 41*a*, 42*a*, and 43*a*.

The top electrode 50 includes a first electrode part 50*a* which is positioned on an upper side of the first insulating layer 42 and a second electrode part 50*b* which is positioned on a lower side of the first electrode part 50*a*. The first electrode part 50*a* is provided within a fourth hole 44*a* of the fourth insulating layer 44 and the upper side part of the second hole 43*a* of the second insulating layer 43 (the above-described first hole part). The first electrode part 50*a* and the second electrode part 50*b* are substantially circular in a top view. A cross-sectional area ES1 of the first electrode part 50*a* in a direction orthogonal to the stacking direction is greater than a cross-sectional area ES2 of the second electrode part 50*b* in a direction orthogonal to the stacking direction. The top electrode 50 is formed of a material such as tungsten (W), tantalum (Ta), tantalum nitride (TaN), titanium (Ti), and titanium nitride (TiN).

Figure 2:
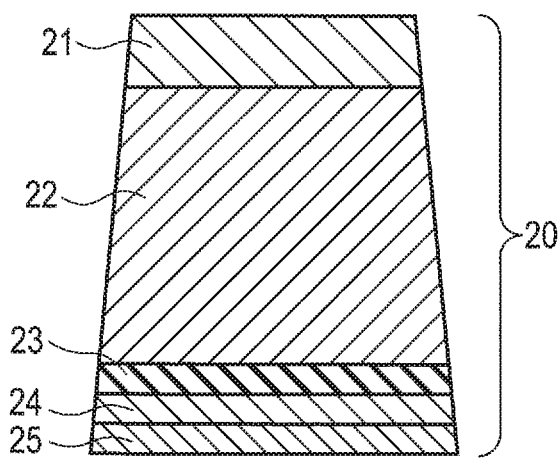
FIG. 2 is a schematic cross-sectional view of a stacked structure of the magnetic memory device of the embodiment.

FIG. 2 is a schematic cross-sectional view of the stacked structure 20 of the magnetic memory device (semiconductor integrated circuit device) of the embodiment.

The stacked structure 20 includes a magnetic layer and the magnetic layer includes a storage layer 24 as a first magnetic layer and a reference layer 22 as a second magnetic layer. Furthermore, the stacked structure 20 includes, in addition to the storage layer 24 and the reference layer 22, an under layer 25, tunnel barrier layer 23 as a nonmagnetic layer, and cap layer 21.

The under layer 25 is disposed on the bottom electrode 12 and is an underlying layer of the storage layer 24.

The storage layer (first magnetic layer) 24 is a ferromagnetic layer having perpendicular magnetization (magnetization direction orthogonal to the main surface), having a variable magnetization direction, and containing at least iron (Fe) and boron (B). Furthermore, the storage layer 24 may further contain, in addition to iron (Fe) and boron (B), cobalt (Co). Note that a variable magnetization direction means that a magnetization direction changes in response to a predetermined write current.

The reference layer (second magnetic layer) 22 is a ferromagnetic layer having perpendicular magnetization, and having a fixed magnetization direction. Although this is not shown, the reference layer 22 includes a first layer part and a second layer part, and the first layer part included in the reference layer 22 contains at least iron (Fe) and boron (B). Furthermore, the first layer part included in the reference layer 22 may further contain, in addition to iron (Fe) and boron (B), cobalt (Co). The second layer part included in the reference layer 22 contains cobalt (Co) and at least one element selected from platinum (Pt), nickel (Ni), and palladium (Pd). Note that a fixed magnetization direction means that a magnetization direction does not change in response to a predetermined write current.

The tunnel barrier layer (nonmagnetic layer) 23 is an insulating layer disposed between the storage layer 24 and the reference layer 22 and contains magnesium (Mg) and oxygen (O).

The cap layer 21 is disposed between the reference layer 22 and the top electrode 50, and is formed of a predetermined metal material.

As can be understood from the above, in the present embodiment, the reference layer 22 is disposed above the storage layer 24. Note that the storage layer 24 may be disposed above the reference layer 22 instead.

Now, a manufacturing method of the magnetic memory device (semiconductor integrated circuit device) of the embodiment will be explained with reference to FIGS. 3 to 15.

Figure 3:
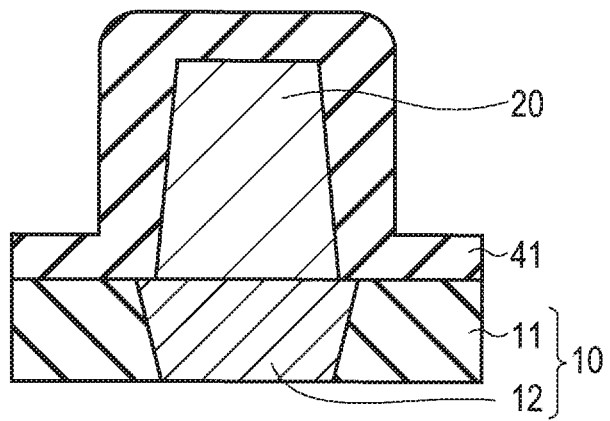
FIG. 3 is a schematic cross-sectional view of a part of a manufacturing method of the magnetic memory device of the embodiment.

Initially, a bottom structure 10 including, for example, a semiconductor substrate (not shown), MOS transistor (not shown), interlayer insulating film 11, and bottom electrode 12 is formed. Then, a stacked structure 20 including, for example, the above-described magnetic layer (reference layer 22 and storage layer 24) and nonmagnetic layer 23 is formed on the bottom structure 10, and a third insulating layer 41 covering the stacked structure 20 is formed. As a result, the condition of FIG. 3 is achieved.

Figure 4:
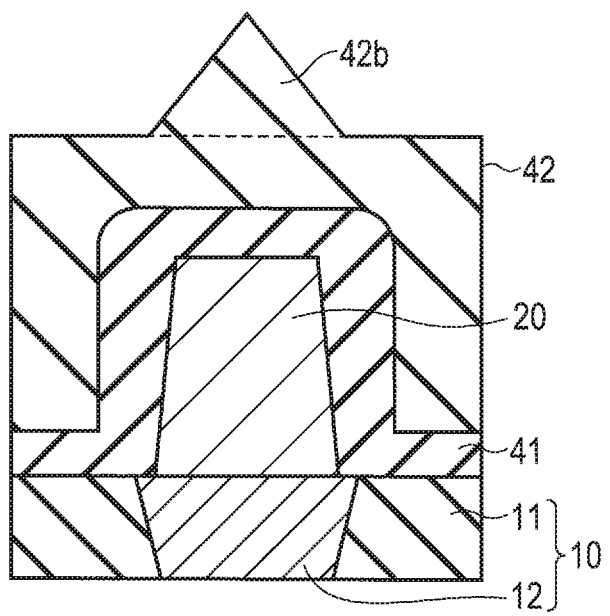
FIG. 4 is a schematic cross-sectional view of a part of the manufacturing method of the magnetic memory device of the embodiment.

Then, as shown in FIG. 4, the first insulating layer 42 with a protrusion 42b based on the stacked structure 20 and covering the stacked structure 20 is formed on the third insulating layer 41 through a high density plasma chemical vapor deposition (HDPCVD) method. The HDPCVD method is a type of plasma CVD and is a method in which a film is formed by plasma while a bias voltage is applied thereto. The first insulating layer 42 is formed while being etched. Through the HDPCVD method, the protrusion 42b is formed in a position corresponding to the pattern of the stacked structure 20. The position corresponding to the pattern of the stacked structure 20 is a position directly above the stacked structure 20. Here, the protrusion 42b has a conical shape.

Then, as shown in FIG. 5A, the second insulating layer 43 is formed on the first insulating layer 42 of a material different from that used for the first insulating layer 42. In FIG. 5A, the second insulating layer 43 is formed in a thickness which does not cover the apex of the protrusion 42b of the first insulating layer 42. At that time, a second hole 43a is formed in the second insulating layer 43 corresponding to the protrusion 42b. Note that the second insulating layer 43 may be formed in a thickness which covers the apex of the protrusion 42b of the first insulating layer 42. In that case, as shown in FIG. 5B, a protrusion 43e of shape corresponding to the protrusion 42b of the first insulating layer 42 may be formed as a part of the second insulating layer 43.

Figure 6:
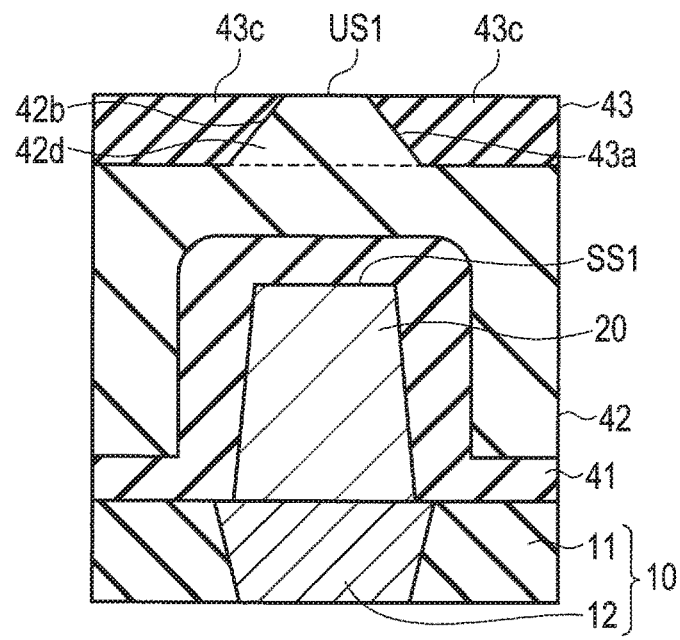
FIG. 6 is a schematic cross-sectional view of a part of the manufacturing method of the magnetic memory device of the embodiment.

Then, the first insulating layer 42 (protrusion 42b) and the second insulating layer 43 are polished through chemical mechanical polishing (CMP) to flatten the first insulating layer 42 (protrusion 42b) and the second insulating layer 43. Specifically, the upper part 42c of the protrusion 42b of the first insulating layer 42 and the upper part 43b of the second insulating layer 43 are removed. As a result of flattening, as shown in FIG. 6, the lower part 42d which is left as a result of removing of the upper part 42c of the protrusion 42b and the lower part 43c which is left as a result of removing of the upper part 43b of the second insulating layer 43, which surrounds the lower part 42d of the protrusion 42b.

In the flattening process, the first insulating layer 42 and the second insulating layer 43 are polished until the area US1 of the upper surface of the lower part 42d of the protrusion 42b passing through the second insulating layer 43 becomes a suitable size. The suitable size is a size required as a cross-sectional area ES2 of the second electrode part 50b of the top electrode 50 contacting the upper surface of the stacked structure 20. The flattening is performed such that the area US1 of the upper surface of the lower part 42d of the protrusion 42b becomes less than the area SS1 of the upper surface of the stacked structure 20.

Note that, in the flattening process, a degree of polishing of the first insulating layer 42 (protrusion 42b) and the second insulating layer 43 may be controlled by controlling a time to execute CMP. Thereby, the area US1 of the upper surface of the lower part 42d of the protrusion 42b can be adjusted to a suitable size.

If the second insulating layer 43 is formed to cover the apex of the protrusion 42b of the first insulating layer 42 as shown in FIG. 5B, the upper part 42c of the protrusion 42b of the first insulating layer 42, upper part 43b of the second insulating layer 43, and protrusion 43e of the second insulating layer 43 are removed through the flattening of the first insulating layer 42 and the second insulating layer 43.

Figure 7:
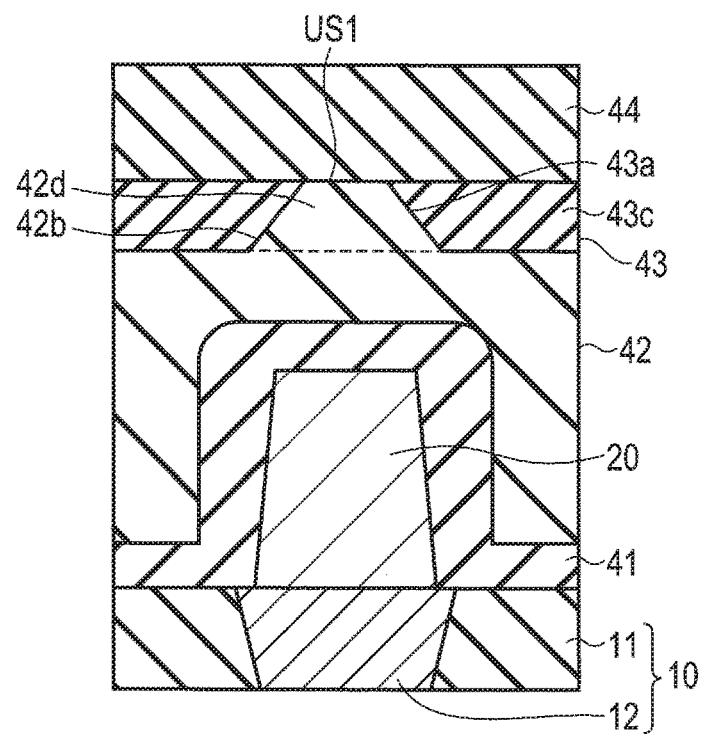
FIG. 7 is a schematic cross-sectional view of a part of the manufacturing method of the magnetic memory device of the embodiment.

Then, as shown in FIG. 7, a fourth insulating layer 44 is formed on the flattened protrusion 42b (lower part 42d) and the second insulating layer 43 (lower part 43c).

Figure 8:
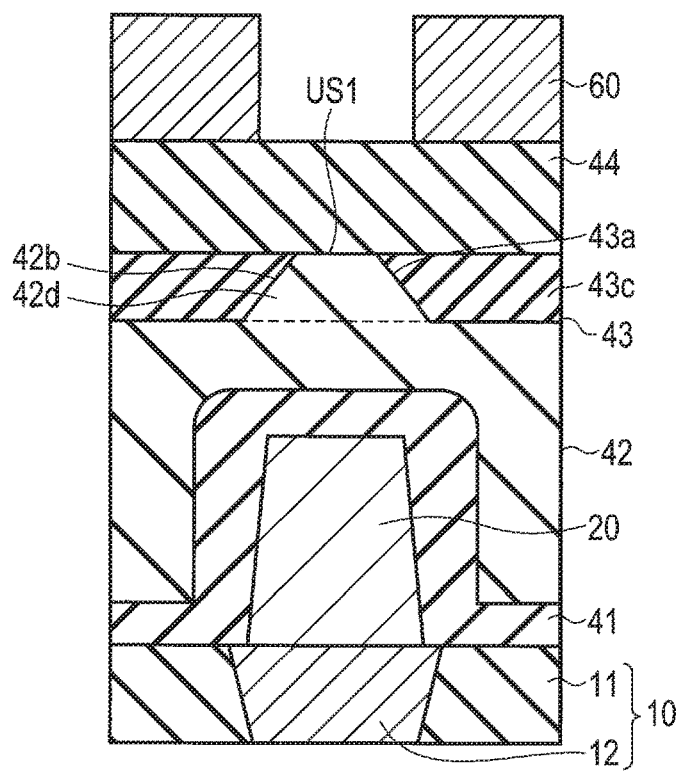
FIG. 8 is a schematic cross-sectional view of a part of the manufacturing method of the magnetic memory device of the embodiment.

Then, as shown in FIG. 8, a mask layer 60 is formed on the fourth insulating layer 44.

Then, as a process to form a through hole 70 reaching the stacked structure 20, etching is performed. In the present embodiment, etching is performed in two parts; first etching and second etching.

Initially, first etching is performed. The first etching includes performing etching of the fourth insulating layer 44 using a mask layer 60 as a mask and performing etching of the first insulating layer 42 using the lower part 43c of the second insulating layer 43 (the part left after the flatting process using CMP in FIGS. 5A, 5B, and 6) as a mask. The first etching is performed to reach the third insulating layer 41.

Figure 9:
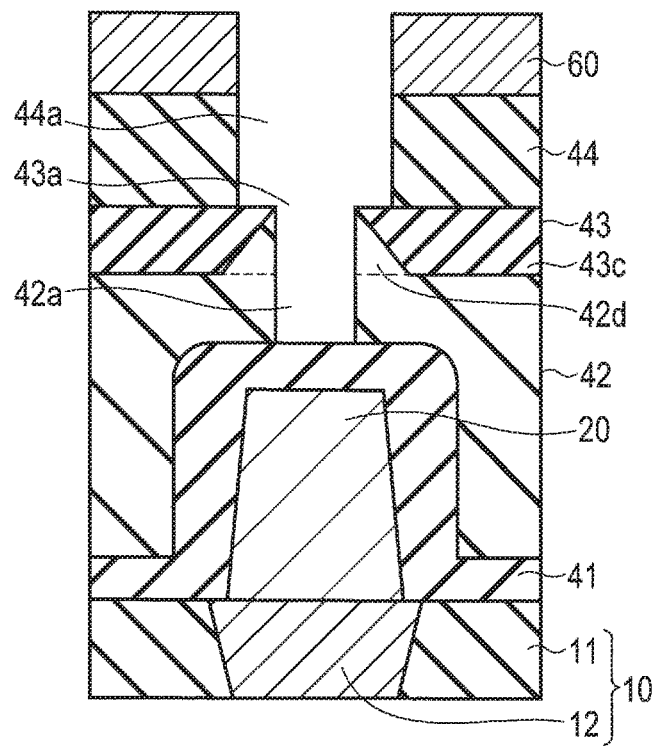
FIG. 9 is a schematic cross-sectional view of a part of the manufacturing method of the magnetic memory device of the embodiment.

As a result of the first etching, as shown in FIG. 9, a first hole 42a is formed in the first insulating layer 42 and a fourth hole 44a is formed in the fourth insulating layer 44. Note that the second hole 43a is already formed in the process of forming the second insulating layer 43 (cf. FIGS. 5A and 5B).

Then, the second etching is performed. The second etching includes performing etching of the third insulating layer 41 using the first insulating layer 42 etched in the process of first etching as a mask. Here, since the third insulating layer 41 is formed of a material etching selectivity of which is high with respect to the first insulating layer 42, the first insulating layer 42 functions as a mask when the third insulating layer 41 is etched. The second etching is performed to reach the stacked structure 20.

Figure 10:
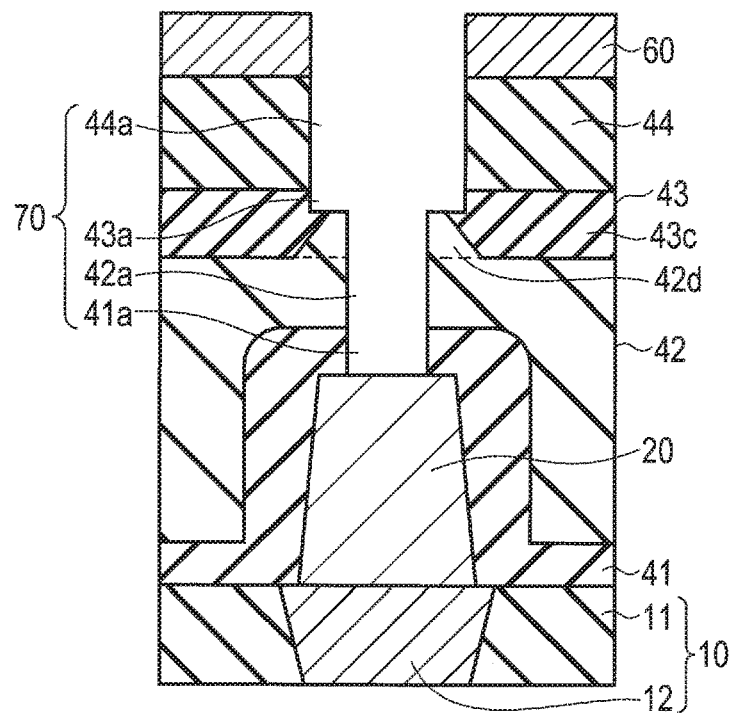
FIG. 10 is a schematic cross-sectional view of a part of the manufacturing method of the magnetic memory device of the embodiment.

As a result of the second etching, as shown in FIG. 10, a third hole 41a is formed in the third insulating layer 41 as shown in FIG. 10. As a result, a through hole 70 reaching the stacked structure 20 is formed. Here, the area of the first hole 42a and the third hole 41a is the same as the area US1 of the upper surface of the lower part 42d of the protrusion 42b formed in the flattening process.

Note that, in FIG. 10, the second insulating layer 43 is etched in the second etching; however, the second insulating layer 43 may not be etched in the second etching which mainly targets the etching of the third insulating layer 41.

Figure 11:
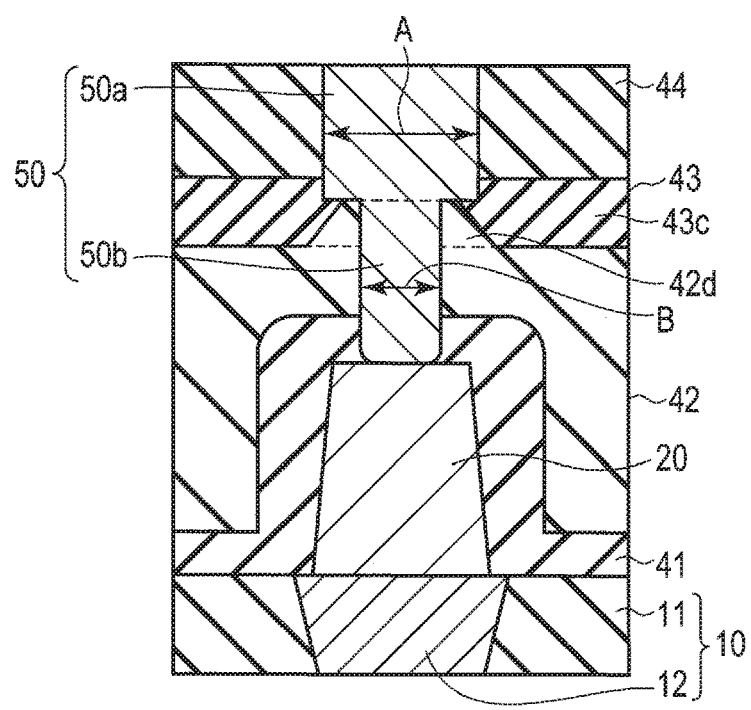
FIG. 11 is a schematic cross-sectional view of a part of the manufacturing method of the magnetic memory device of the embodiment.

Now, after the mask layer 60 is removed, as shown in FIG. 11, a top electrode 50 connected to the stacked structure 20 is formed inside the through hole 70 formed by the first etching and the second etching. A diameter A of the first electrode part 50a and a diameter B of the second electrode part 50b satisfy a relationship of A>B.

Figure 12:
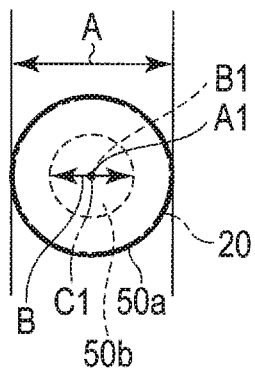
FIG. 12 shows a positional relationship between the top electrode and the stacked structure of the magnetic memory device of FIG. 11.

A positional relationship between the top electrode 50 and the stacked structure 20 of the magnetic memory device (semiconductor integrated circuit device) shown in FIG. 11 is shown in FIG. 12. FIG. 12 shows that, in the magnetic memory device (semiconductor integrated circuit device) of FIG. 11, the position of center A1 of the first electrode part 50a of the top electrode 50 and the position of center B1 of the second electrode part 50b of the top electrode 50 substantially match. Furthermore, FIG. 12 shows that the position of center A1 of the first electrode part 50a and the position of center C1 of the upper surface of the stacked structure 20 substantially match. However, the position of center A1 of the first electrode part 50a of the top electrode 50 and the position of center C1 of the upper surface of the stacked structure 20 may not match as shown in FIG. 12. This is because the position of center of opening of the mask layer 60 is not always formed to match the position of center C1 of the upper surface of the stacked structure 20 in the process of forming the mask layer 60.

Figure 13:
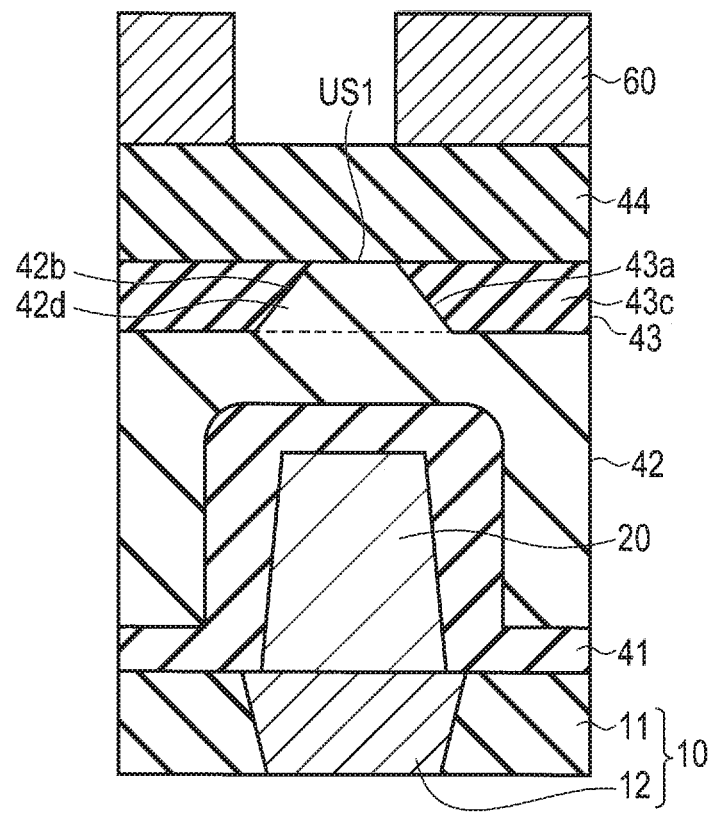
FIG. 13 is a schematic cross-sectional view of a part of a manufacturing method of the magnetic memory device of the embodiment.
Figure 14:
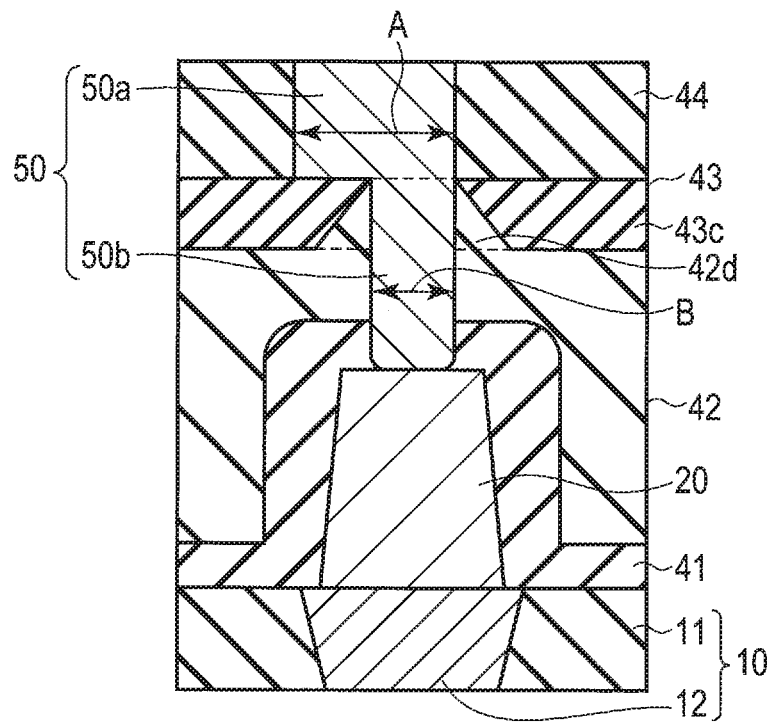
FIG. 14 is a schematic cross-sectional view of a part of the manufacturing method of the magnetic memory device of the embodiment.
Figure 15:
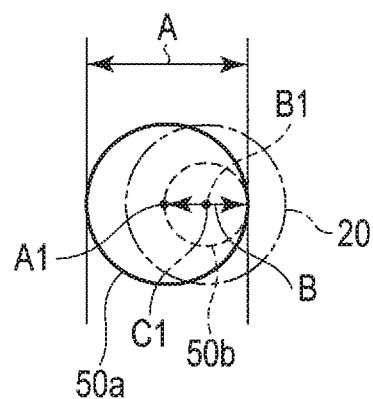
FIG. 15 shows a positional relationship between the top electrode and the stacked structure of the magnetic memory device of FIG. 14.

For example, if the mask layer 60 is formed in the position of FIG. 13, the shape of through hole formed by performing the first etching and the second etching differs from the shape of through hole 70 shown in FIG. 10. If the top electrode 50 is formed inside the through hole shape of which is different from that of through hole 70 of FIG. 10, the shape of top electrode 50 becomes as shown in FIG. 14. A positional relationship of the top electrode 50 and the stacked structure 20 of the magnetic memory device (semiconductor integrated circuit device) of FIG. 14 is shown in FIG. 15. FIG. 15 shows that the position of center A1 of the first electrode part 50a of the top electrode 50 and the position of center B1 of the second electrode part 50b are shifted. Furthermore, FIG. 15 shows that the position of center A1 of the first electrode part 50a of the top electrode 50 and the position of center C1 of the upper surface of the stacked structure 20 are shifted.

However, even in such a case, the first insulating layer 42 and the third insulating layer 41 are etched using the lower part 43c of the second insulating layer 43 as a mask, and the first hole 42a and the third hole 41a are formed directly above the stacked structure 20. Furthermore, the area of the first hole 42a and the third hole 41a is formed to be the same as the area US1 of the upper surface of the lower part 42d of the protrusion 42b. Since the flattening process is performed to keep the area US1 of the upper surface of the lower part 42d of the protrusion 42b less than the area SS1 of the upper surface of the stacked structure 20, the area of the first hole 42a and the third hole 41a is formed to be less than the area SS1 of the upper surface of the stacked structure 20. Thus, the second electrode part 50b of the top electrode 50 can be formed to contact the upper surface of the stacked structure 20.

Thus, the top electrode 50 can be formed in a suitable position of the stacked structure 20 with a suitable size.

Effects of the manufacturing method of the magnetic memory device (semiconductor integrated circuit device) of the present embodiment will be explained as compared to a comparative example of FIGS. 16 and 17.

In a manufacturing method of a magnetic memory device (semiconductor integrated circuit device) of the comparative example, the second insulating layer 43 is not formed. A stacked structure 20 is formed on a bottom structure 10, and a third insulating layer 41 and a first insulating layer 42 are formed to cover the stacked structure 20. Then, a mask layer is formed on the first insulating layer 42, and the first insulating layer 42 and the third insulating layer 41 are etched using the mask layer as a mask. Then, a top electrode 50 is formed within a through hole 70 formed by the etching process.

In the method of the comparative example, when the first insulating layer 42 and the third insulating layer 41 are etched while the position of center of an opening of the mask layer and the position of center of the upper surface of the stacked structure 20 are shifted, the through hole 70 may not be formed within the upper surface of the stacked structure 20.

Figure 16:
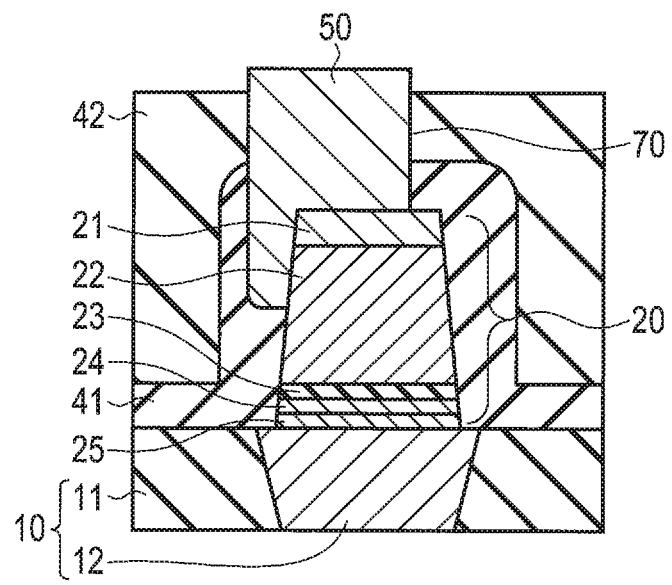
FIG. 16 is a cross-sectional view of a magnetic memory device of a comparative example in which a top electrode is formed in a position unsuitable for a magnetoresistive element.
Figure 17:
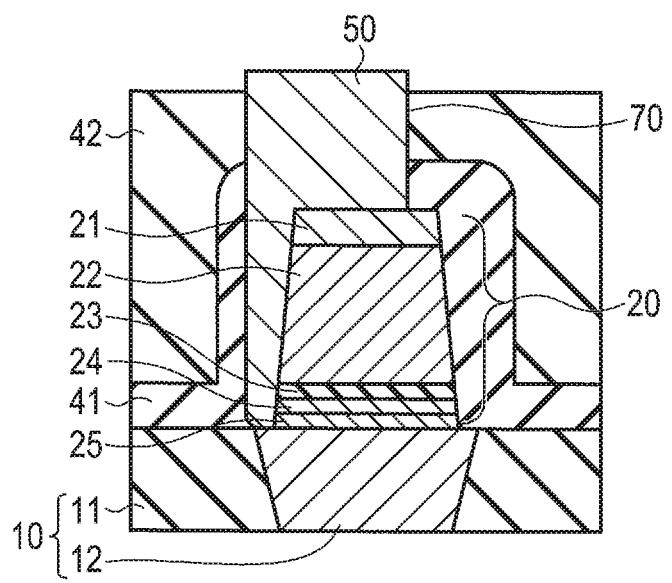
FIG. 17 is a cross-sectional view of the magnetic memory device of the comparative example in which a top electrode is formed in a position unsuitable for the magnetoresistive element.

If the position of mask layer is shifted with respect to the stacked structure 20, the through hole 70 may reach not only the upper surface of the stacked structure 20 but also the side surface as shown in FIG. 16. In that case, in a washing process of the through hole 70 which is a step before the forming of the top electrode 50, a part of the magnetic layer included in the stacked structure 20 may be oxidized and changed into a high resistive layer. This is not desirable for characteristics of the magnetic memory device (semiconductor integrated circuit device). Then, if the top electrode 50 is formed within the through hole 70, as shown in FIG. 16, the top electrode 50 is formed to contact not only the upper surface of the stacked structure 20 but also the side surface thereof.

Furthermore, if a mask layer is not formed in a position corresponding to the stacked structure 20, the through hole 70 may reach the bottom electrode 12 as a result of etching of the first insulating layer 42 and the third insulating layer 41. In that case, if the top electrode 50 is formed within the through hole 70, the top electrode 50 is formed to contact the side surface of stacked structure 20 and bottom electrode 12 as shown in FIG. 17. Thus, disadvantages such as the top electrode 50 and the bottom electrode 12 are conducted, and the reference layer 22 and the storage layer 24 sandwiching the tunnel barrier layer 23 are conducted may occur.

On the other hand, in the present embodiment, the through hole 70 is formed using the protrusion 42b, and thus, the position of the centers of the first hole 42a and the third hole 41a in the through hole 70 through which the second electrode part 50b passes and the position of the center of upper surface of the stacked structure 20 can substantially match. Furthermore, the flattening process is performed to keep the area US1 of the upper surface of the lower part 42d of the protrusion 42b less than the area SS1 of the upper surface of the stacked structure 20, and thus, the area of the first hole 42a and the third hole 41a can be formed less than the area SS1 of the upper surface of the stacked structure 20.

Thus, when the top electrode 50 is formed within the through hole 70 formed in the manufacturing process of the present embodiment, the second electrode part 50b of the top electrode 50 is formed within the upper surface of the stacked structure 20, and thus, the top electrode 50 is prevented from contacting the side surface of the stacked structure 20 or the bottom electrode 12. That is, the top electrode 50 can be formed in a position suitable for the stacked structure 20.

Thus, the problem in the above comparative example can be solved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A magnetic memory device comprising:
a stacked structure including a magnetic layer;

a first insulating layer covering the stacked structure and including a protrusion based on the stacked structure;

a second insulating layer provided on the first insulating layer and formed of a material different from a material of the first insulating layer; and an electrode connected to the stacked structure, wherein:

the first insulating layer has a first hole passing through the first insulating layer, the electrode is connected to the stacked structure at least through the first hole, the second insulating layer has a second hole inside of which a part of the electrode and the protrusion are provided, the second hole includes a part whose area increases toward the stacked structure, the electrode includes a first electrode part which is positioned on an upper side of the protrusion of the first insulating layer and a second electrode part which is positioned on a lower side of the first electrode part, and the second electrode part is in contact with the first insulating layer and out of contact with the second insulating layer.

2. The device of claim 1, further comprising a third insulating layer provided between the stacked structure and the first insulating layer, the third insulating layer having a third hole and formed of a material different from the material of the first insulating layer, wherein the electrode is connected to the stacked structure further through the third hole.

3. The device of claim 2, further comprising a fourth insulating layer provided on the second insulating layer, the fourth insulating layer having a fourth hole, wherein the electrode is connected to the stacked structure further through the fourth hole.

4. The device of claim 1, wherein the first hole and the second hole are positioned directly above the stacked structure.

5. The device of claim 1, wherein a center of the first hole and a center of the second hole match.

6. The device of claim 1, wherein a cross-sectional area of the first electrode part in a plane orthogonal to a stacking direction of the stacked structure is greater than a cross-sectional area of the second electrode part in the plane orthogonal to the stacking direction.

7. The device of claim 1, wherein a main component of the second insulating layer is selected from silicon nitride, silicon boron nitride, silicon carbon nitride, boron nitride, metal oxide, and metal nitride.

8. The device of claim 1, wherein the first insulating layer is formed of a silicon oxide.

9. The device of claim 1, wherein the stacked structure includes a first magnetic layer having a variable magnetization direction, a second magnetic layer having a fixed magnetization direction, and a non-magnetic layer provided between the first magnetic layer and the second magnetic layer.

10. A manufacturing method of a magnetic memory device, the method comprising:

forming a stacked structure including a magnetic layer on a lower structure;

forming a first insulating layer covering the stacked structure, the first insulating layer including a protrusion with an apex based on the stacked structure;

forming a second insulating layer on the first insulating layer with a material different from a material of the first insulating layer;

removing an upper part of the second insulating layer and an upper part of the protrusion to leave a lower part of the protrusion and a lower part of the second insulating layer, which surrounds the lower part of the protrusion;

forming a through hole reaching the stacked structure; and forming an electrode connected to the stacked structure inside the through hole, wherein the forming of the through hole reaching the stacked structure includes etching the first insulating layer using the lower part of the second insulating layer as a mask.

11. The method of claim 10, further comprising forming a third insulating layer covering the stacked structure before forming the first insulating layer, wherein the forming of the through hole reaching the stacked structure further includes etching the third insulating layer using the first insulating layer etched as a mask.

12. The method of claim 10, further comprising:

forming a fourth insulating layer on the lower part of the protrusion and the lower part of the second insulating layer; and forming a mask layer on the fourth insulating layer, wherein the forming of the through hole reaching the stacked structure further includes etching the fourth insulating layer using the mask layer as a mask.

13. The method of claim 10, wherein the protrusion has a conical shape.

14. The method of claim 10, wherein the stacked structure includes a first magnetic layer having a variable magnetization direction, a second magnetic layer having a fixed magnetization direction, and a non-magnetic layer provided between the first magnetic layer and the second magnetic layer.

* * * * *